United States Patent [19]
Bogner et al.

[11] Patent Number: 5,999,552
[45] Date of Patent: Dec. 7, 1999

[54] RADIATION EMITTER COMPONENT

[75] Inventors: Georg Bogner; Herbert Brunner; Heinz Haas, all of Regensburg; Johann Luft, Wolfsegg; Ernst Nirschl, Wenzenbach; Werner Spaeth, Holzkirchen; Norbert Stath; Wolfgang Teich, both of Regensburg, all of Germany

[73] Assignee: Siemens Aktiengesellschaft, Munich, Germany

[21] Appl. No.: 09/009,606

[22] Filed: Jan. 20, 1998

Related U.S. Application Data

[63] Continuation of application No. PCT/DE96/01295, Jul. 16, 1996.

[30] Foreign Application Priority Data

Jul. 19, 1995 [DE] Germany .......................... 195 26 398

[51] Int. Cl.$^6$ .............................. H01S 3/18; H01L 33/00
[52] U.S. Cl. ................................................ 372/43; 257/94
[58] Field of Search ................... 372/36, 43, 44; 257/94

[56] References Cited

U.S. PATENT DOCUMENTS

| | | | |
|---|---|---|---|
| 4,143,394 | 3/1979 | Schöberl | 257/98 |
| 4,255,688 | 3/1981 | Nagasawa | 313/499 |
| 5,068,866 | 11/1991 | Wada et al. | 372/36 |
| 5,414,293 | 5/1995 | Broom | 257/433 |
| 5,744,828 | 4/1998 | Nozaki et al. | 257/94 |

FOREIGN PATENT DOCUMENTS 37 32 075 A1  4/1989  Germany .

OTHER PUBLICATIONS

"Effect of growth interruption on performance of AlGaAs/InGaAs/GaAs quantum well lasers" (Bugge et al.), Journal of Crystal Growth, vol. 145, 1994, pp. 907–910; (No Month Available).

"Metalorganic chemical vapor deposition growth of high–quality and highly uniform strained InGaAs quantum wells in a high–speed rotating–disk reactor" (Karakida et al.), Journal of Crystal Growth, vol. 145, 1994, pp. 662–667 (No Month Available).

"660nm Wavelength GaInAsP/AlGaAs Distributed Feedback Lasers", Chong et al Electronic Letters, vol. 24, No. 7, Mar. 31, 1988, pp. 416–418.

"GaAs/AlGaAs quantum well laser for high–speed applications" (Lang et al.), IEEE Proceedings–J, vol. 138, No. 2, Apr. 1991, pp. 117–121.

(List continued on next page.)

*Primary Examiner*—Rodney Bovernick
*Assistant Examiner*—Quyen Phan Leung
*Attorney, Agent, or Firm*—Herbert L. Lerner; Laurence A. Greenberg

[57] ABSTRACT

A radiation emitter component, in particular an infrared emitter component with a conventional light-emitting diode housing, includes two electrode connections, one of which has a well-shaped reflector. The housing has an optically transparent, electrically non-conducting encapsulation material. A semiconductor laser chip is fastened in a well-shaped reflector of the light-emitting diode housing. The semiconductor laser chip has a quantum well structure, in particular with a strained layer structure, for example MOVPE epitaxial layers with a layer sequence GaAlAs-InGaAs-GaAlAs. A diffusor material can be inserted into the optically transparent, electrically non-conducting material of the light-emitting diode housing. The diffusor material is constructed or inserted with regard to type and concentration in such a way that in connection with the semiconductor laser chip encapsulated in the light-emitting diode housing, a radiation characteristic curve or an increase of an effective emission surface is produced that is comparable to that of a conventional infrared light-emitting diode.

25 Claims, 2 Drawing Sheets

OTHER PUBLICATIONS

"Threshold current on short cavity uncoated strained–layer InGaAs–GaAs MQW lasers" (Xiao et al.), Conference on Lasers and Electro–Optics, vol. 12, pp. 380–381; Oct. 5, 1992.

"Low–threshold InGaAs strained–layer quantum well laser ($\lambda$=0.98$\mu$m) with GaInP cladding layers prepared by chemical beam epitaxy" (Tsang et al.), Applied Physics Letters 61(7), Aug, 17, 1992, pp. 755–757.

"Tensile–Strained AlGaAsP–and InGaAsP–(AlGa)$_{0.5}$In$_{0.5}$P Quantum Well Laser Diodes for TM–Mode Emission in the Wavelength Range 650<$\lambda$<850 nm" (Bour et al.), IEEE Photonic Technology Letters, No. 11, Nov. 1994; pp. 1283–1285.

"High–power, high–temperature InGaAs–AlGaAs strained–layer quantum–well diode lasers" (Wang et al.), Electronics Letters, vol. 30, No. 8, Apr. 14, 1994; pp. 646–648.

Patent Abstracts of Japan No. 52–149081 (Ohara), dated Dec. 10, 1977;.

Patent Abstracts of Japan No. 62–130573 (Hayashi), dated Jun. 12, 1987.

Patent Abstracts of Japan No. 53–27026 (Ishizaki), dated Dec. 10, 1993.

Patent Abstract of Japan No. 62–252181 (Tamura), dated Nov. 2, 1987.

RADIATION EMITTER COMPONENT

CROSS-REFERENCE TO RELATED APPLICATION

This application is a continuation of International Application Serial No. PCT/DE96/01295, filed Jul. 16, 1996, which designated the United States.

BACKGROUND OF THE INVENTION

Field of the Invention

The invention relates to a radiation emitter component including a semiconductor laser chip having a semiconductor substrate, an active laser layer constructed on the semiconductor substrate and having a quantum well structure, and at least one first and one second contact layer each connected to the active laser layer in an electrically conducting manner. The invention relates in particular to an infrared emitter component.

In the prior art, conventional light-emitting diodes on one hand, and GaAs-infrared light-emitting diodes, for example, on the other hand, are known as optoelectronic luminescence components. Due to their limited optical properties, the mass-produced conventional light-emitting diodes cannot as a rule be used where higher power, shorter switching times, and low wavelength band widths are required. In fact, an attempt has been made to improve such infrared light-emitting diodes, for example by adding GaAs-GaAlAs material with so-called double heterotransitions in order to increase power and data rates and to improve them by adding a transparent substrate to increase power further. However, despite those measures, the use of that kind of light-emitting diode particularly in the computer and computer peripheral field has only been possible to a greatly limited degree up till now. That application field has previously been limited almost exclusively to optoelectronic laser components. Due to a high degree of mechanical sensitivity of semiconductor laser chips, until now they have been mounted in the usual way in the known unencapsulated metal housings, e.g. TO-18 housings or SMD housings (Surface-Mounted Device housings). An example of a metal housing of that kind is shown in German Published, Non-Prosecuted Patent Application DE 37 32 075 A1, corresponding to U.S. Pat. No. 4,940,855.

Semiconductor laser chips with a semiconductor substrate and an active laser layer that is constructed on the semiconductor substrate and has a quantum well structure are known, for example, from the following publications:

H. Lang et al.: GaAs/AlGaAs Quantum Well Laser for High-Speed Applications, IEE PROCEEDINGS J. OPTOELECTRONICS, Vol. 138, No. 2, Apr. 1, 1991, pp. 117–121;

C. A. Wang et al.: High Power, High Temperature InGaAs-AlGaAs Strained-Layer Quantum-Well Diode Lasers, Electronics Letters, Vol. 30, No. 8, Apr. 14, 1994, pp. 646–648;

W. T, Tsang et al.: Low-Threshold InGaAs Strained-Layer Quantum Well Lasers ($\lambda$=0.98 $\mu$m) with GaInP Cladding Layers Prepared by Chemical Beam Epitaxy, Applied Physics Letters, Vol. 61, No. 7, Aug. 17, 1992, pp. 755–757;

D. P. Bour et al.: Tensile-Strained AlGaAsP- and InGaAsP-(AlGa)$_{0.5}$In$_{0.5}$P Quantum Well Laser Diodes for TM-Mode Emission in the Wavelength Range 650<$\lambda$<850 nm, IEEE Photonics Technology Letters, Vol. 6, No. 11, November, 1994, pp. 1283–1285;

Patent Abstracts of Japan, Vol. 002, No. 027 (E-016), Feb. 21, 1978, JP-A-52 149 081;

F. Bugge et al.: Effect of Growth Interruption on Performance of AlGaAs/InGaAs/GaAs Quantum Well Lasers, Journal of Crystal Growth, Vol. 145, 1994, pp. 907–910; and S. Karakida et al.: Metalorganic Chemical Vapor Deposition Growth of High-Quality and Highly Uniform Strained InGaAs Quantum Wells in a High-Speed Rotating-Disk Reactor, Journal of Crystal Growth, Vol. 145, 1994, pp. 662–667.

SUMMARY OF THE INVENTION

It is accordingly an object of the invention to provide a radiation emitter component, in particular an infrared emitter component, which overcomes the hereinafore-mentioned disadvantages of the heretofore-known devices of this general type, which meets higher demands when used for signal transmission (particularly in the computer field) over air intervals and which at the same time can be assembled in a conventional assembly line that is constructed for mass production, with a high production yield and high reliability of chips.

With the foregoing and other objects in view there is provided, in accordance with the invention, a radiation emitter component, comprising a semiconductor laser chip including a front surface; a bond contacting surface disposed on the front surface of the semiconductor laser chip; a semiconductor substrate with a back surface; an active laser layer disposed on the semiconductor substrate and having a quantum well structure; at least one first and one second contact layer each electrically conductively connected to the active laser layer; the first contact layer constructed as an electrically conducting contacting disposed over the entire area on the back surface of the semiconductor substrate; and the second contact layer electrically connected to the bond contacting surface; and a light-emitting diode housing encapsulating the semiconductor laser chip, the light-emitting diode housing encapsulation having an optically transparent, electrically non-conducting material, in particular a plastic material.

In accordance with another feature of the invention, the semiconductor laser chip is an infrared light-emitting semiconductor laser chip.

In accordance with a further feature of the invention, in order to deflect the laterally emitting laser light toward the front, the semiconductor laser chip is attached in a well-shaped reflector of the light-emitting diode housing.

In accordance with an added feature of the invention, there is provided a diffusor material which is inserted into the optically transparent, electrically non-conducting material of the light-emitting diode (LED) housing.

In accordance with an additional feature of the invention, the diffusor material is constructed or inserted with regard to type and concentration in such a way that in connection with the semiconductor laser chip encapsulated in the light-emitting diode housing, a radiation characteristic curve is produced that is comparable to a conventional infrared light-emitting diode (and not with that of a narrow-angle radiating laser), or that an increase of the effective emission area is produced. Through the broadening and breaking of the coherence of the laser beam with the diffusor surface of the reflector and the introduction of a diffusor into the plastic casting in order to scatter the light, a radiation characteristic curve can be produced that is comparable to the previously known infrared light-emitting diodes so that the light can no longer be focused, which is advantageous for increasing safety to the eye.

The principle of the invention is based on the discovery of improving a semiconductor laser chip that is known per se for power operation in such a way that it can be prepared for assembly in a light-emitting diode (LED) line constructed for mass production in order to thus be able to produce semiconductor laser components in greater quantities than was previously possible in a reasonably priced assembly technique, analogous to the conventional light-emitting diodes (LEDs). In contrast to the conventional GaAs-infrared LEDs, the semiconductor laser chip according to the invention and the infrared emitter component according to the invention offer the advantages of higher power, higher data rates, higher reliability with similarly low production costs, high reliability against malfunctions, and high safety to the eye. For this reason, the laser chips or components according to the invention open up a new application field, particularly in the computer and computer peripheral fields, which particularly for infrared signal transmission over air intervals, in particular in pulse operation, place higher demands that could not be fulfilled with conventional IR LEDs or with prior semiconductor laser components.

In accordance with yet another feature of the invention, the active laser layer includes a quantum well structure, in particular with a number of layers epitaxially deposited from the metal organic vapor phase (MOVPE epi-layers=Metal Organic Vapor Phase Epi-layers). In order to achieve particularly high power, short switching times, and a narrow wavelength window with fewer malfunctions due to outside light and a very narrow wavelength band width, the MOVPE epi-material can have a so-called strained quantum well structure.

In accordance with yet a further feature of the invention, the individual epitaxial layers of the active laser layer are constructed to be tensed in relation to one another, i.e. no lattice matching of the individual layers takes place as is otherwise the norm, so that lattice errors and crystal interruptions in the tensed layers are suppressed and are frozen, so to speak. A strained quantum well structure of this kind furthermore also produces a mechanically more robust and more insensitive laser device, which permits an assembly with conventional LED housings in LED production lines currently in use, with sufficiently high production yield and reliability of the chips. Among other things, the previous semiconductor laser chips also had a high mechanical sensitivity which did not permit this kind of more robust type of assembly, but instead had to be mounted in special, costly housing types of the kind mentioned at the beginning.

The higher power required in the applications mentioned above, particularly in pulse operation, cannot be achieved with any conventional infrared light-emitting diode. The short switching times do not exist in a conventional infrared light-emitting diode and according to the invention, they consequently open up new applications, particularly in the computer field. The low spectral band width permits an interference-free parallel operation of a number of systems, primarily in connection with wavelength selective detectors.

Apart from an InGaAs quantum well structure, the use of InGaAsP quantum well material with a suitable composition is also possible, in particular with a wavelength of the laser light of up to over 1400 nm, with the advantage of freedom from interference due to outside light and a clearly reduced danger to the eye.

In accordance with yet an added feature of the invention, as in the infrared light-emitting diodes that are known per se, the semiconductor substrate can represent a GaAs substrate following the principle of the invention, but with a higher dislocation density, at least provided that an unacceptable aging is prevented, with the advantage of lower costs.

The back side metalization of the semiconductor substrate according to the invention permits an adhesive connection of the semiconductor laser chip in the well reflector that is standard for a light-emitting diode housing, wherein the chip is hermetically cast with an optically transparent plastic in a manner analogous to an LED. Furthermore, the second contact layer electrically connected to the active laser layer is electrically connected to a bond contacting surface constructed on the front surface of the semiconductor laser chip so that a trouble-free processing of the semiconductor laser chip in the LED assembly line can be assured through the use of wire bonds with a wire made of aluminum or gold and a better detectability and bond security can be assured in connection therewith.

In another embodiment, the previously conventional coatings of the laser mirror without unacceptable aging can be eliminated, with the advantage of a disposition of the semiconductor laser chip, which disposition is standard for LED chips, for the removal of the assembly foil, which can in turn achieve cost advantages in the assembly.

Other features which are considered as characteristic for the invention are set forth in the appended claims.

Although the invention is illustrated and described herein as embodied in a radiation emitter component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
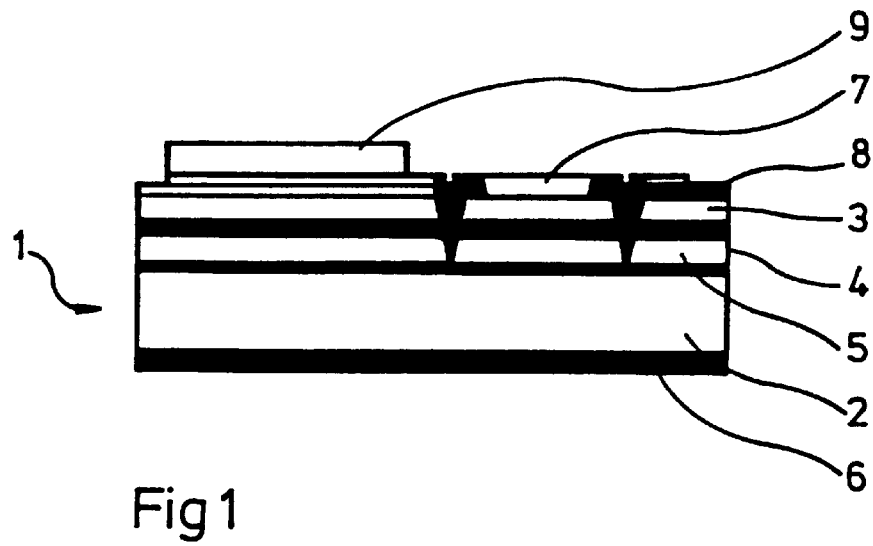
FIG. 1 is a diagrammatic, sectional view of a semiconductor laser chip according to the invention.
Figure 2:
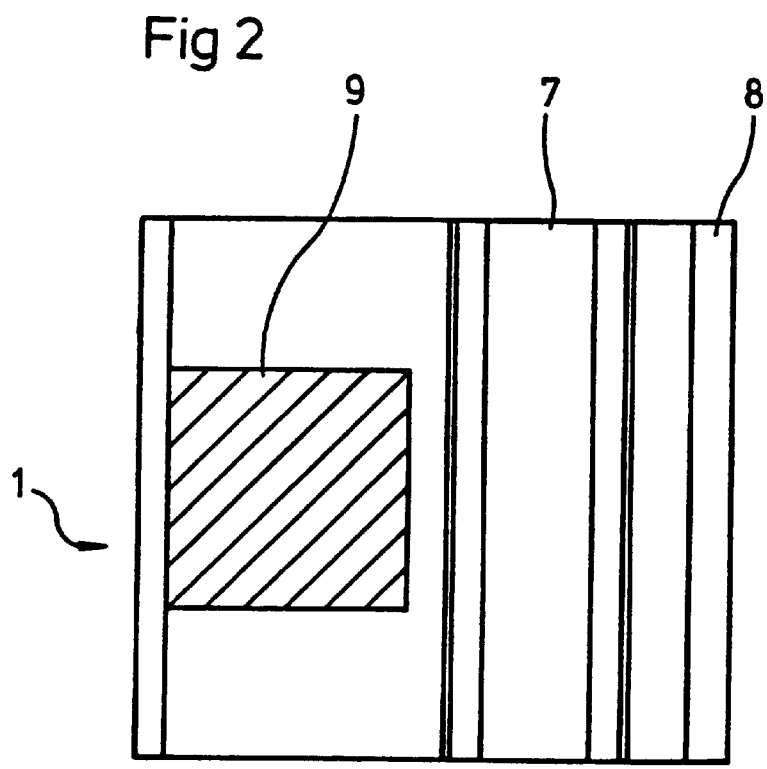
FIG. 2 is a top-plan view of a semiconductor laser chip according to the invention.

Referring now to the figures of the drawings in detail and first, particularly, to FIGS. 1 and 2 thereof, there is seen an exemplary embodiment of a semiconductor laser chip 1 according to the invention, with a semiconductor substrate 2, an active laser layer which is constructed on the semiconductor substrate 2 and is formed of a GaAlAs p-epitaxial layer 3, an InGaAs quantum well layer 4, and a GaAlAs n-epitaxial layer 5, as well as a first contact layer 6 of the n type and a second contact layer 7 of the p type, each of which is electrically connected to the active laser layer. The reference numeral 8 indicates an existing insulation layer formed of $Al_2O_3$. According to the invention, the first contact layer 6 is constructed as an electrically conducting contacting that is constructed over the entire area on the back surface of the semiconductor substrate 2. Furthermore, a bond contacting surface 9 is provided, which is constructed on the front surface of the semiconductor laser chip and is electrically connected to the second contact layer 7. The bond contacting surface 9, which is constructed to be virtually square, has an approximate side length of 130 μm according to FIG. 2. Other dimensions of the semiconductor laser chip are approximately 100 μm in thickness, approximately 300 μm in width and approximately 320 μm in length.

Figure 3:
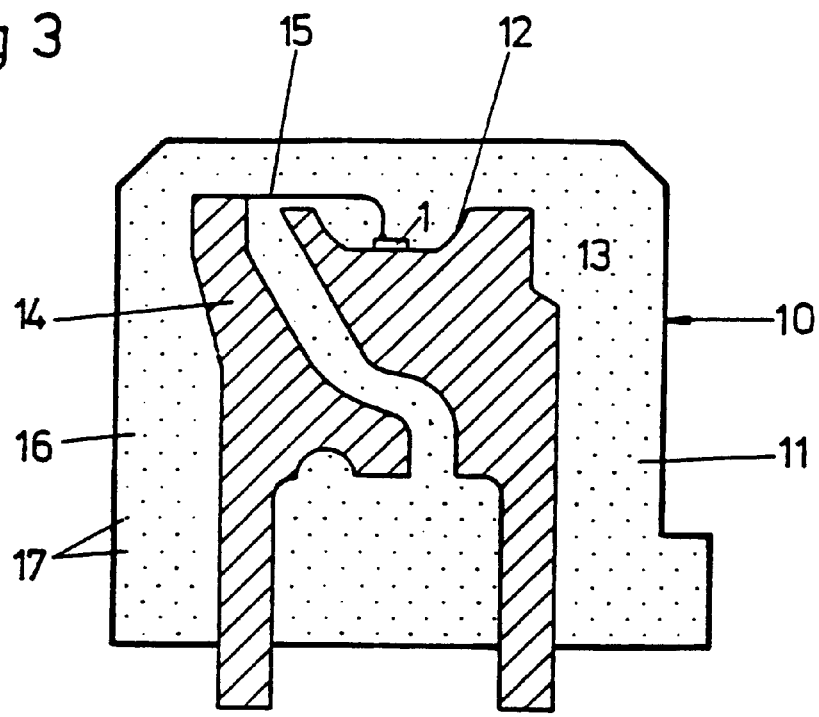
FIG. 3 is a sectional view of an infrared emitter component with a light-emitting diode housing.

FIG. 3 shows an infrared emitter component 10 according to the invention, with the semiconductor laser chip 1 encapsulated in a conventional light-emitting diode housing 11. The chip 1 is glued with the electrically conducting contacting 6, which is constructed over the entire area on the back surface of the substrate 2, inside a well-shaped reflector 12 of a first electrode connection 13 and in this manner assures the electrical contact. A second electrode connection 14 is electrically connected to the bond contacting surface 9 of the semiconductor laser chip by a bond wire 15 made of Al or Au. The LED housing 11 has an optically transparent, electrically non-conducting encapsulating material 16, which is formed in particular of plastic. A diffusor material 17, which is indicated with dots in FIG. 3, is inserted into the encapsulating material 16.

The housing 11 can, for example, be a conventional LED housing of the Siemens SFH 495p type (5 mm, T1 ¾, flat, black color, 2.54 mm raster, cathode identification: short connection). The component according to the invention can also be supplied in a belted form.

Consequently, according to the invention, a stimulated emitter component with a very high efficiency can be provided as a laser diode in a diffused housing, which is particularly suited for pulse operation at high voltages and stands out due to a high degree of reliability.

Figure 4:
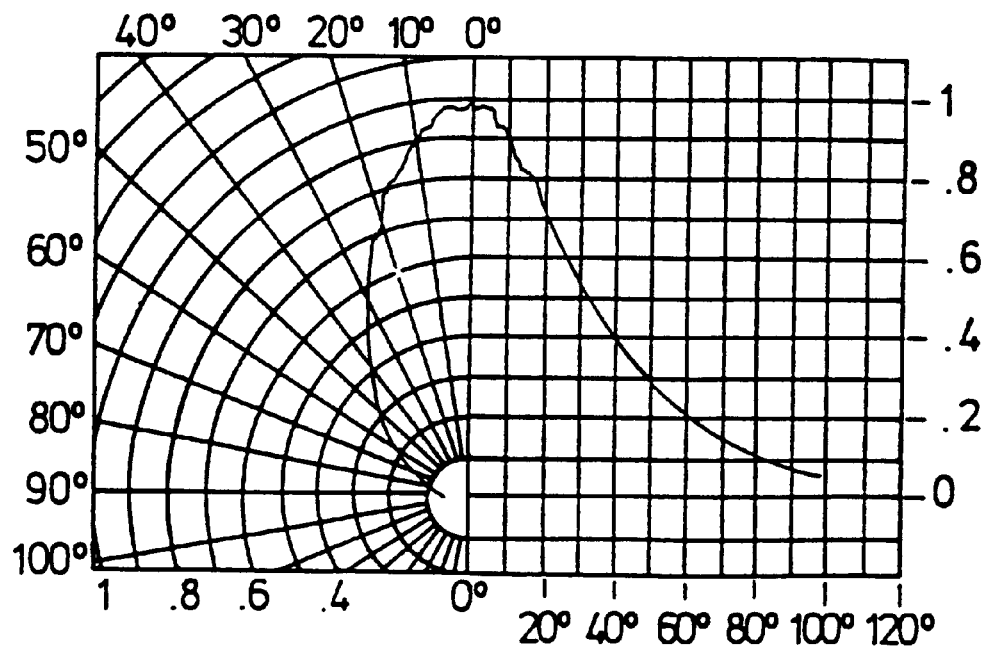
FIG. 4 is a graph showing a radiation characteristic curve of the infrared emitter component according to the invention.

FIG. 4 is a graph showing a radiation characteristic curve of the infrared emitter component according to the invention, which is self-explanatory.

We claim:

1. A radiation emitter component, comprising:
    a semiconductor laser chip including:
        a front surface;
        a bond contacting surface disposed on said front surface of said semiconductor laser chip;
        a semiconductor substrate with a back surface;
        an active laser layer disposed on said semiconductor substrate and having a quantum well structure;
        at least one first and one second contact layer each electrically conductively connected to said active laser layer;
        said first contact layer constructed as an electrically conducting contacting disposed over the entire area on said back surface of said semiconductor substrate; and
        said second contact layer electrically connected to said bond contacting surface; and
    a light-emitting diode housing encapsulating said semiconductor laser chip, said light-emitting diode housing encapsulation having an optically transparent, electrically non-conducting material and a diffusor material inserted into said optically transparent, electrically non-conducting material.

2. The radiation emitter component according to claim 1, wherein said optically transparent, electrically non-conducting material is a plastic material.

3. The radiation emitter component according to claim 1, wherein said active laser layer has an epitaxial material deposited from the metal organic vapor phase.

4. The radiation emitter component according to claim 3, wherein said active laser layer includes a plurality of layers.

5. The radiation emitter component according to claim 3, wherein said active laser layer includes at least three epitaxially deposited layers.

6. The radiation emitter component according to claim 3, wherein said epitaxially deposited layers have a layer sequence selected from the group consisting of GaAlAs-InGaAs-GaAlAs and GaAlAs-InGaAsP-GaAlAs.

7. The radiation emitter component according to claim 4, wherein said layers of said active laser layer are individually tensed or strained relative to one another.

8. The radiation emitter component according to claim 5, wherein said epitaxial layers of said active laser layer are individually tensed or strained relative to one another.

9. The radiation emitter component according to claim 6, wherein said epitaxial layers of said active laser layer are individually tensed or strained relative to one another.

10. The radiation emitter component according to claim 1, wherein said semiconductor substrate is a GaAs substrate.

11. The radiation emitter component according to claim 10, wherein said GaAs substrate has a relatively high dislocation density.

12. The radiation emitter component according to claim 1, wherein said diffusor material is constructed with regard to type and concentration for giving said semiconductor laser chip encapsulated in said light-emitting diode housing a radiation characteristic curve comparable to that of a conventional infrared light-emitting diode.

13. The radiation emitter component according to claim 1, wherein said diffusor material is inserted with regard to type and concentration for giving said semiconductor laser chip encapsulated in said light-emitting diode housing a radiation characteristic curve comparable to that of a conventional infrared light-emitting diode.

14. The radiation emitter component according to claim 1, including a reflector device inside said light-emitting diode housing for deflecting laser light radiated by said semiconductor laser chip toward the front.

15. The radiation emitter component according to claim 14, wherein said light-emitting diode housing has two electrode connections, said reflector device is a well-shaped reflector of one of said two electrode connections, and said semiconductor laser chip is fastened in said well-shaped reflector.

16. The radiation emitter component according to claim 15, wherein said semiconductor laser chip having said electrically conducting contacting disposed over the entire area of said back surface of said semiconductor substrate, is electrically conductively connected to said well-shaped reflector of said light-emitting diode housing.

17. The radiation emitter component according to claim 1, wherein said semiconductor laser chip radiates infrared laser light.

18. A radiation emitter component, comprising:
    a semiconductor laser chip for emitting a laser beam;
    a light-emitting diode housing encapsulating said semiconductor laser chip, said light-emitting diode housing encapsulation having an optically transparent, electrically non-conducting material; and
    a diffusor material inserted into said optically transparent, electrically non-conducting material, said diffusor material being used for broadening and breaking the coherence of the laser beam.

19. The radiation emitter component according to claim 18, wherein said optically transparent, electrically non-conducting material is a plastic material.

20. The radiation emitter component according to claim 18, wherein said diffusor material is constructed with regard to type and concentration for giving said semiconductor laser chip encapsulated in said light-emitting diode housing a radiation characteristic curve comparable to that of a conventional infrared light-emitting diode.

21. The radiation emitter component according to claim 18, wherein said diffusor material is inserted with regard to type and concentration for giving said semiconductor laser chip encapsulated in said light-emitting diode housing a radiation characteristic curve comparable to that of a conventional infrared light-emitting diode.

22. The radiation emitter component according to claim 18, including a reflector device having a reflection direction and positioned inside said light-emitting diode housing for deflecting laser light radiated by said semiconductor laser chip in said reflection direction.

23. The radiation emitter component according to claim 22, wherein said light-emitting diode housing has two electrode connections, said reflector device is a well-shaped reflector of one of said two electrode connections, and said semiconductor laser chip is fastened in said well-shaped reflector.

24. The radiation emitter component according to claim 23, wherein said semiconductor laser chip is electrically conductively connected to said well-shaped reflector.

25. The radiation emitter component according to claim 18, wherein said semiconductor laser chip radiates infrared laser light.

* * * * *